(12) United States Patent
Liou et al.

(10) Patent No.: US 8,486,733 B2
(45) Date of Patent: Jul. 16, 2013

(54) PACKAGE HAVING LIGHT-EMITTING ELEMENT AND FABRICATION METHOD THEREOF

(75) Inventors: Jia-Shin Liou, Taichung (TW);
Wen-Hao Lee, Taichung (TW);
Hsien-Wen Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 29 days.

(21) Appl. No.: 13/156,003

(22) Filed: Jun. 8, 2011

(65) Prior Publication Data

US 2012/0256215 A1  Oct. 11, 2012

(30) Foreign Application Priority Data

Apr. 11, 2011  (TW) .............................. 100112424 A

(51) Int. Cl.
*H01L 21/00* (2006.01)
*H01L 23/495* (2006.01)

(52) U.S. Cl.
USPC ............... 438/27; 438/26; 438/106; 257/667; 257/E33.061; 257/E33.059

(58) Field of Classification Search
USPC .................. 257/787, 788, 796, 100, 667, 678, 257/E33.061, E33.059; 438/112, 127, 122, 438/15, 25–27, 51, 53, 55, 106
See application file for complete search history.

(56) References Cited

U.S. PATENT DOCUMENTS

| 2006/0102917 A1* | 5/2006 | Oyama et al. ................... 257/99 |
| 2007/0170454 A1* | 7/2007 | Andrews ....................... 257/100 |
| 2010/0001310 A1* | 1/2010 | Chang .......................... 257/100 |

FOREIGN PATENT DOCUMENTS

JP   07335741 A  * 12/1995

OTHER PUBLICATIONS

English machine translation of JP 07335741 A.*

* cited by examiner

*Primary Examiner* — Matthew Landau
*Assistant Examiner* — Khaja Ahmad
(74) *Attorney, Agent, or Firm* — Edwards Wildman Palmer LLP; Peter F. Corless; Steven M. Jensen

(57) ABSTRACT

A package having a light-emitting element includes a substrate having a light-emitting element disposed thereon, an insulating layer formed on the substrate and having an opening for exposing the light-emitting element, a florescent layer formed in the opening of the insulating layer for encapsulating the light-emitting element, and a transparent material formed on the florescent layer and the insulating layer. As such, a specific space can be defined by the insulating layer for exposing the light-emitting element and forming the fluorescent layer, thereby overcoming the problem of non-uniform coating of phosphor powder as encountered in prior techniques.

9 Claims, 5 Drawing Sheets

PACKAGE HAVING LIGHT-EMITTING ELEMENT AND FABRICATION METHOD THEREOF

CROSS-REFERENCES TO RELATED APPLICATIONS

This application claims under 35 U.S.C. §119(a) the benefit of Taiwanese Application No. 100112424, filed Apr. 11, 2011, the entire contents of which is incorporated herein by reference.

BACKGROUND OF THE INVENTION

1. Field of the Invention

The present invention relates to semiconductor packages, and more particularly, to a package having a light-emitting element and a fabrication method thereof.

2. Description of Related Art

Along with the development of semiconductor technologies, various semiconductor packages have appeared. Fabrication of a light-emitting diode (LED) package involves frame design (including light extraction and heat dissipation), chip selection and arrangement, chip bonding, gold wire formation, phosphor coating, silicone lens disposing and so on. These fabrication processes greatly affect the characteristics of the LED package such as thermal performance (thermal resistance), luminous flux, light-emitting efficiency, correlated color temperature (CCT), color rendering index (CRI), light color uniformity, lifetime and so on.

Generally, the phosphor coating process plays a key role in achieving high light color uniformity and high luminous flux. Referring to FIG. 1A, a fluorescent layer 14 is conventionally formed by uniformly distributing a phosphor powder in an encapsulant through dispensing. However, under long-term use, particles 140 of the fluorescent layer 14 can be non-uniformly distributed due to deposition. As such, light from the LED chip 11 takes different paths and portions of the fluorescent powder distant from the LED chip 11 reflect light, thus resulting in non-uniform light color distribution and making it difficult to meet user demands.

Accordingly, other coating techniques are developed, such as a conformal coating method of FIG. 1B, a thin film attaching method of FIG. 1C or a spray coating method of FIG. 1D.

However, in FIG. 1B, an electrophoresis process needs to be performed for coating the fluorescent layer 14 on the LED chip 11. Such an electrophoresis process requires specific devices, thus resulting in a high fabrication cost.

Further, in FIG. 1C, a thin film 14' of phosphor powder is attached to a transparent material 15 around the LED chip 11 so as to be positioned distant from the LED chip 11 that dissipates a large amount of heat. However, as the transparent material 15 has a low refractive index (a resin material has a refractive index of 1.54 and the phosphor powder has a refractive index of 1.8), it results in a low light-emitting efficiency of the LED chip 11.

Furthermore, the spray-coating method of FIG. 1D can only be applicable to a COB (chip on board) type LED package instead of an LED package with the substrate thereof having a recess. If a spray coating process is performed to a substrate 10 having a recess 100, particles 140 (phosphor powder) of the fluorescent layer 14 can be sprayed onto a reflective layer 16 on inclined surfaces of the recess 100, thus reducing the reflective area of the reflective layer 16 and accordingly decreasing the light-emitting efficiency of the LED chip 11.

Therefore, there is a need to provide a fabrication method of a package having a light-emitting element so as to overcome the above-described drawbacks.

SUMMARY OF THE INVENTION

Accordingly, the present invention provides a fabrication method of a package having a light-emitting element, which comprises the steps of: providing a substrate having at least a light-emitting element disposed thereon; forming an insulating layer on the substrate, wherein the insulating layer has an opening for exposing the light-emitting element; forming a fluorescent layer in the opening of the insulating layer for encapsulating the light-emitting element; and forming a transparent material on the fluorescent layer and the insulating layer.

In another embodiment of the fabrication method of the present invention, the substrate has a recess for the light-emitting element to be disposed therein. The insulating layer can be formed on the substrate and in the recess and have an opening for exposing the light-emitting element and portions of the recess.

The formation of the insulating layer can comprise: forming a resist layer on the substrate, in the recess and on the light-emitting element, wherein the resist layer has open areas for exposing portions of the substrate and the recess; forming the insulating layer on the portions of the substrate and the recess exposed from the open areas; and removing the resist layer for exposing the light-emitting element and portions of the recess.

In the above-described fabrication methods, the light-emitting element can be a light-emitting diode (LED). The insulating layer can be made of one of the group consisting of silicone gel, silicone resin and epoxy resin. The transparent material can be made of one of the group consisting of silicone gel, silicone resin and epoxy resin. The fluorescent layer can be made of phosphor powder or phosphor powder mixed with a polymer glue material.

According to the present invention, the insulating layer is patterned to form an opening therein such that the light-emitting element can be exposed from the opening and a fluorescent layer can further be formed in the opening for encapsulating the light-emitting element, thereby overcoming non-uniform coating of phosphor powder as encountered in the prior art and maintaining a preferred light-emitting efficiency.

Further, through the patterning process of the insulating layer, the fluorescent layer can be easily formed with a reduced fabrication cost. Furthermore, the thickness of the fluorescent layer is easy to control so as to provide a preferred light-emitting efficiency and maintain uniform distribution of light color due to uniform thickness of the fluorescent layer.

The fabrication methods of the present invention can be applied to various kinds of substrates.

In addition, the present invention provides a package having a light-emitting element, which comprises: a substrate; at least a light-emitting element disposed on the substrate; an insulating layer formed on the substrate and having an opening for exposing the light-emitting element; a fluorescent layer formed in the opening of the insulating layer for encapsulating the light-emitting element; and a transparent material formed on the fluorescent layer and the insulating layer.

In another embodiment of the package of the present invention, the substrate has a recess so as for the light-emitting element to be disposed therein. The insulating layer is formed on the substrate and in the recess and has an opening for exposing the light-emitting element.

In the above-described packages, the light-emitting element can be a light-emitting diode (LED). The insulating layer can be made of one of the group consisting of silicone gel, silicone resin and epoxy resin. The transparent material can be made of one of the group consisting of silicone gel, silicone resin and epoxy resin. The fluorescent layer can be made of phosphor powder or phosphor powder mixed with a polymer glue material.

Therefore, by defining a specific space in the insulating layer for exposing the light-emitting element and encapsulating the light-emitting element with a fluorescent layer, the present invention overcomes non-uniform coating of phosphor powder as encountered in the prior art and eliminates the need of expensive devices for controlling the thickness of the fluorescent layer. Furthermore, through the insulating layer, the present invention can easily control the thickness of the fluorescent layer so as to provide a preferred light-emitting efficiency and maintain uniform distribution of light color due to uniform thickness of the fluorescent layer.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "above", etc. are merely for illustrative purpose and should not be construed to limit the scope of the present invention.

FIGS. 2A to 2F show a fabrication method of a package having light-emitting elements according to the present invention.

Figure 1A:
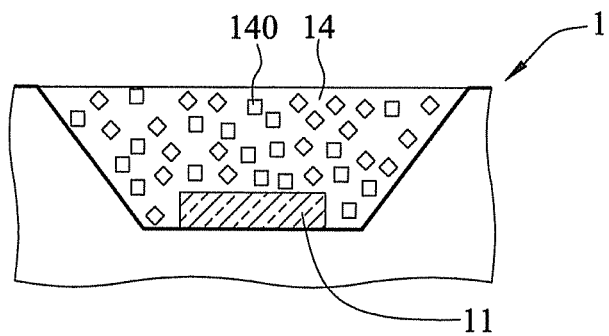
FIGS. 1A to 1D are schematic cross-sectional views showing different embodiments of conventional LED packages.
Figure 1B:
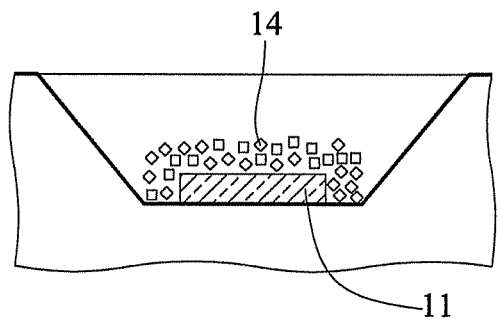
Figure 1C:
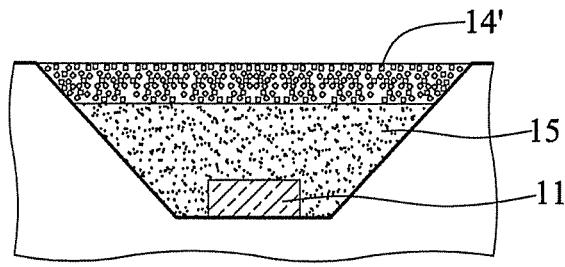
Figure 1D:
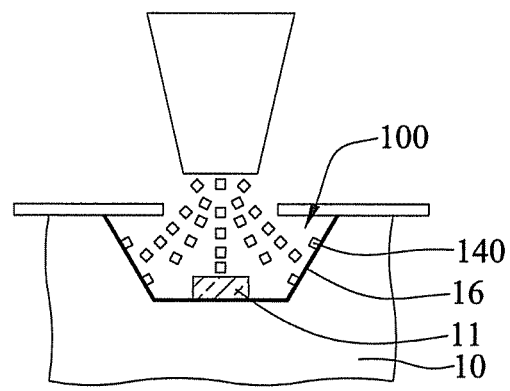
Figure 2A:
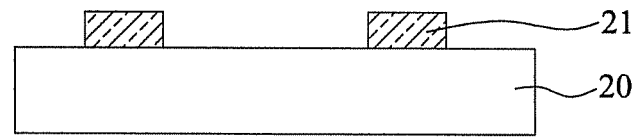
FIGS. 2A to 2F are schematic cross-sectional views showing a fabrication method of a package having a light-emitting element according to the present invention.

Referring to FIG. 2A, a substrate 10 is provided, which has a plurality of light-emitting elements such as LED chips 21 disposed thereon and electrically connected to the substrate 20 (not shown).

Figure 2B:
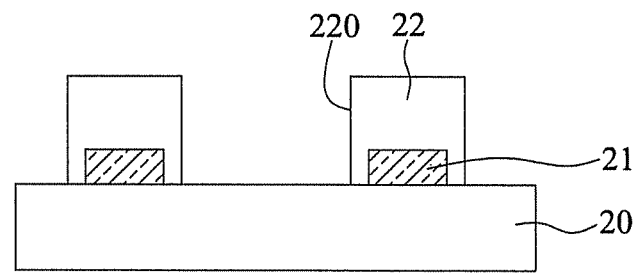

Referring to FIG. 2B, a resist layer 22 is formed on the substrate 20 and the LED chips 21 and a plurality of open areas 220 are formed in the resist layer 22 by patterning so as to expose portions of the substrate 20. The resist layer 22 can be a photoresist layer or a dry film.

Figure 2C:
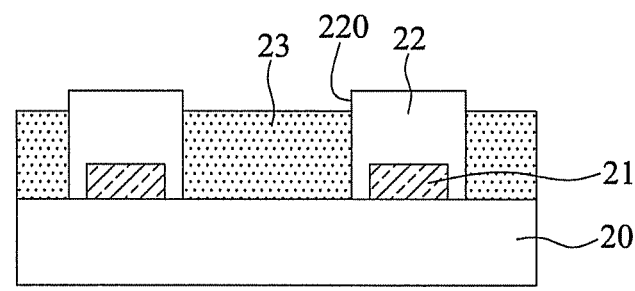

Referring to FIG. 2C, an insulating layer 23 is formed on the portions of the substrate 20 exposed through the open areas 220. In the present embodiment, the insulating layer 24 is made of one of the group consisting of silicone gel, silicone resin and epoxy resin, but is not limited thereto.

Figure 2D:
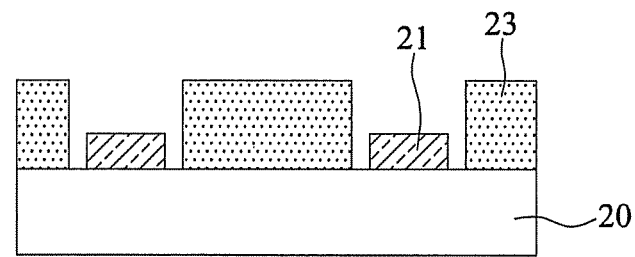

Referring to FIG. 2D, the resist layer 22 is removed so as to form openings in the insulating layer 23 for exposing the LED chips 21 and portions of the substrate 20 previously covered by the resist layer 22.

Figure 2E:
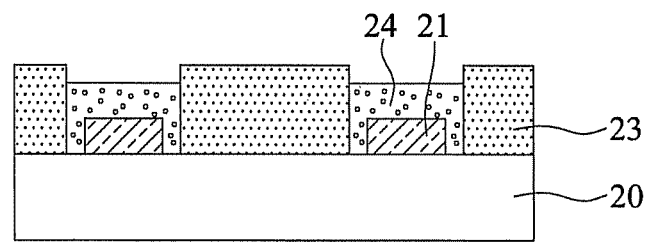

Referring to FIG. 2E, a fluorescent layer 24 is formed in the openings of the insulating layer 23 on the exposed LED chips 21 and the exposed portions of the substrate 20 through a dispensing process or a spray coating process to thereby encapsulate the LED chips 21. The fluorescent layer 24 is made of a light conversion material, such as a phosphor powder or a phosphor powder mixed with a polymer glue material.

Figure 2F:
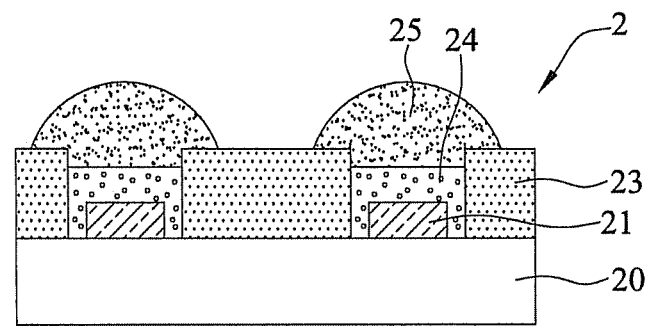

Referring to FIG. 2F, a transparent material 25 is formed on the fluorescent layer 24 and the insulating layer 23 so as to form an LED package 2. Therein, the transparent material 25 can be one of the group consisting of silicone gel, silicone resin and epoxy resin, and have a refractive index between 1.2 and 2.5. Generally, the transparent material 25 is also referred to as a lens.

The LED package 2 has a substrate 20 with LED chips 21 disposed thereon, an insulating layer 23 formed on the substrate 20 and having openings for exposing the LED chips 21, respectively, a fluorescent layer 24 formed in the openings of the insulating layer 23 for encapsulating the LED chips 21, and a transparent material 25 formed on the fluorescent layer 24 and the insulating layer 23.

Through a general patterning process (such as exposure and development of a photoresist layer) and a phosphor powder coating process, the LED chips 21 are exposed through the openings of the insulating layer 23 and encapsulated by the fluorescent layer 24, thereby reducing the fabrication cost and overcoming the conventional drawback of non-uniform coating of phosphor powder.

FIGS. 3A to 3F show another fabrication method of a package having light-emitting elements according to the present invention. The present embodiment is similar to the above-described embodiment. An only difference therebetween is the substrate structure.

Figure 3A:
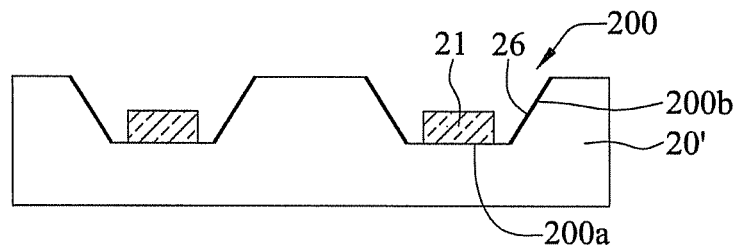
FIGS. 3A to 3F are schematic cross-sectional views showing a fabrication method of a package having a light-emitting element according to another embodiment of the present invention.

Referring to FIG. 3A, a substrate 20' having a plurality of recesses 200 is provided. Each of the recesses 200 has a bottom surface 200a, and two side inclined surfaces 200b having a reflective layer 26 disposed thereon. A plurality of LED chips 21 are disposed on the bottom surfaces 200a of the recesses 200, respectively, and electrically connected to the substrate 20' (not shown).

Figure 3B:
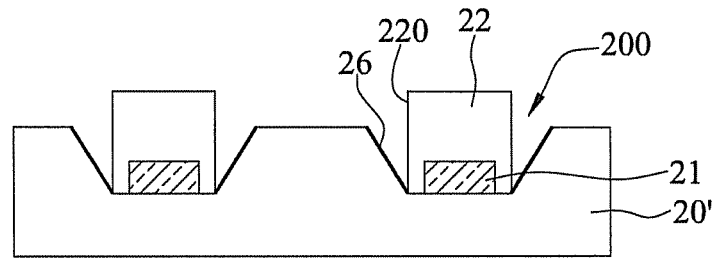

Referring to FIG. 3B, a resist layer 22 is formed on the substrate 20', in the recesses 200 and on the LED chips 21, and a plurality of open areas 220 are formed in the resist layer 22 to expose portions of the substrate 20' and the surfaces of the recesses 200, for example, the reflective layer 26 of the recesses 200.

Figure 3C:
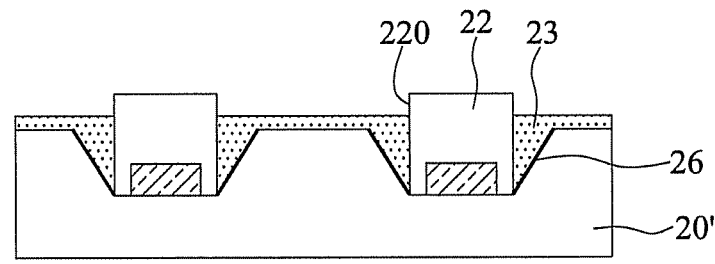

Referring to FIG. 3C, an insulating layer 23 is formed on the portions of the substrate 20 and the surfaces of the recesses 200 exposed from the open areas 220 (that is, the exposed reflective layer 26).

Figure 3D:
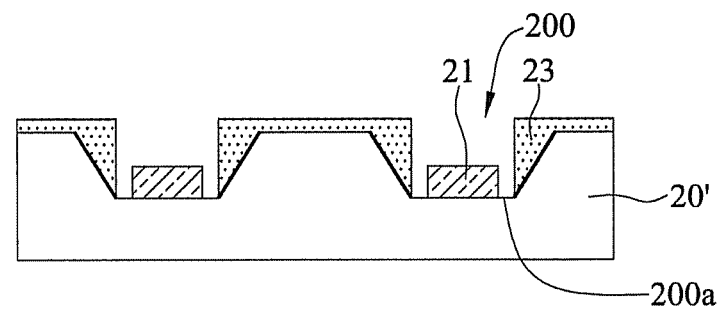

Referring to FIG. 3D, the resist layer 22 is removed so as to form openings in the insulating layer 23 for exposing the LED chips 21 and portions of the recesses 200 previously covered by the resist layer 22, i.e. the bottom surfaces 200a of the recesses 200.

Figure 3E:
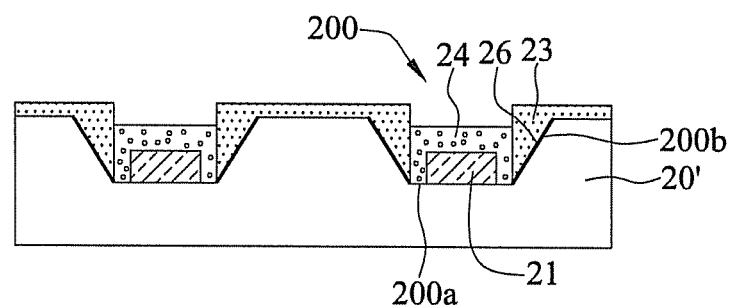

Referring to FIG. 3E, a fluorescent layer 24 is formed in the openings of the insulating layer 23 on the exposed LED chips 21 and the bottom surfaces 200a of the recesses 200 through a dispensing process or a spray coating process to thereby encapsulate the LED chips 21.

During the spray coating process of the fluorescent layer, since the inclined surfaces 200b of the recesses 200 are covered by the insulating layer 23, particles of the fluorescent layer 24 cannot be sprayed onto the inclined surfaces 200b, thereby avoiding reduction of the reflective area of the reflective layer 26 and improving the light-emitting efficiency of the LED chips 21.

Figure 3F:
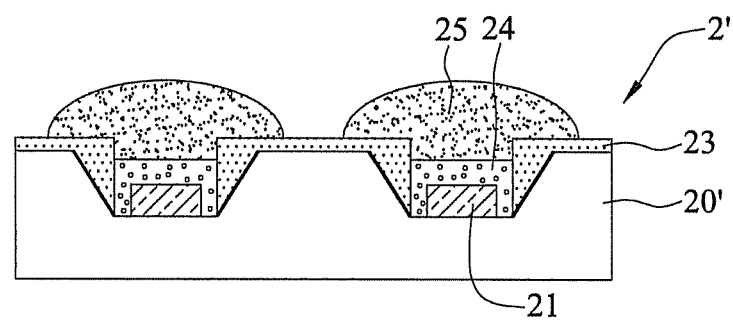

Referring to FIG. 3F, a transparent material 25 is formed on the fluorescent layer 24 and the insulating layer 23 so as to form another LED package 2'.

The LED package 2' has a substrate 20' having a plurality of recesses 200 each having an LED chip 21 disposed therein, an insulating layer 23 formed on the substrate 20 and in the recesses 200 and having openings for exposing the LED chips 21, respectively, a fluorescent layer 24 formed in the openings of the insulating layer 23 for encapsulating the LED chips 21, and a transparent material 25 formed on the fluorescent layer 24 and the insulating layer 23.

Therefore, by using several general processes in combination, the present invention avoids the use of expensive devices required in the prior art, thereby effectively reducing the fabrication cost.

Further, through a patterning process, the present invention can easily control the thickness of the fluorescent layer so as to provide a preferred light-emitting efficiency and maintain uniform distribution of light color due to uniform thickness of the fluorescent layer.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a package having a light-emitting element, comprising the steps of:
    providing a substrate having at least a light-emitting element disposed thereon;
    forming a resist layer on the substrate and the light-emitting element, wherein the resist layer has open areas for exposing portions of the substrate;
    forming an insulating layer on the portions of the substrate exposed from the open areas, wherein the insulating layer has an opening for exposing the light-emitting element;
    removing the resist layer;
    forming a fluorescent layer in the opening of the insulating layer for encapsulating the light-emitting element; and
    forming a transparent material on the fluorescent layer and the insulating layer.

2. The method of claim 1, wherein the substrate has a recess for the light-emitting element to be disposed therein.

3. The method of claim 2, wherein the insulating layer is formed on the substrate and in the recess and has an opening for exposing the light-emitting element.

4. The method of claim 2, wherein the step of forming the insulating layer comprises:
    forming the resist layer in the recess, wherein the open areas are for exposing portions of the recess;
    forming the insulating layer on the portions of the recess exposed from the open areas; and
    removing the resist layer for exposing the portions of the recess.

5. The method of claim 2, wherein a reflective layer is further formed on surfaces of the recess.

6. The method of claim 1, wherein the light-emitting element is a light-emitting diode (LED).

7. The method of claim 1, wherein the insulating layer is made of one of the group consisting of silicone gel, silicone resin and epoxy resin.

8. The method of claim 1, wherein the fluorescent layer is made of phosphor powder or phosphor powder mixed with a polymer glue material.

9. The method of claim 1, wherein the transparent material is made of one of the group consisting of silicone gel, silicone resin and epoxy resin.

\* \* \* \* \*